United States Patent
Song et al.

(10) Patent No.: US 7,687,362 B2
(45) Date of Patent: Mar. 30, 2010

(54) SEMICONDUCTOR DEVICE WITH INCREASED CHANNEL LENGTH AND WIDTH AND METHOD FOR MANUFACTURING THE SAME

(75) Inventors: Seok Pyo Song, Seoul (KR); Dong Sun Sheen, Gyeonggi-do (KR); Young Ho Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 141 days.

(21) Appl. No.: 11/941,194

(22) Filed: Nov. 16, 2007

(65) Prior Publication Data
US 2008/0185663 A1    Aug. 7, 2008

(30) Foreign Application Priority Data
Feb. 6, 2007    (KR) ............... 10-2007-0012362

(51) Int. Cl.
*H01L 29/78*    (2006.01)
(52) U.S. Cl. ............... 438/294; 257/E29.255; 257/E21.409
(58) Field of Classification Search ........... 257/395, 257/E29.255, E21.409, 347; 438/253, 387, 438/243, 294, 291, 163, 589
See application file for complete search history.

(56) References Cited

U.S. PATENT DOCUMENTS

2006/0270153 A1* 11/2006 Lee ..................... 438/253
2007/0246774 A1* 10/2007 Chung et al. ........... 257/347

FOREIGN PATENT DOCUMENTS

KR     1020060058959 A     6/2006

* cited by examiner

*Primary Examiner*—Thomas L Dickey
*Assistant Examiner*—Fazli Erdem
(74) *Attorney, Agent, or Firm*—Ladas Parry LLP

(57) ABSTRACT

A semiconductor device includes a semiconductor substrate having an active region including a channel portion. An isolation layer is formed in the semiconductor substrate to define the active region, and a gate is formed over the channel portion in the active region. The active region of the semiconductor substrate is etched to such that the entire active region is below an upper surface of the isolation layer. A U-shaped groove is formed in the channel portion of the active region, except the edges in a direction of the channel width thereof, in order to increase the channel width. In the semiconductor device, there is an increase in channel length and channel width leading to a reduction in leakage current and on increase in operation current.

7 Claims, 4 Drawing Sheets

SEMICONDUCTOR DEVICE WITH INCREASED CHANNEL LENGTH AND WIDTH AND METHOD FOR MANUFACTURING THE SAME

CROSS-REFERENCE TO RELATED APPLICATIONS

The present application claims priority to Korean patent application number 10-2007-0012362 filed on Feb. 06, 2007, which is incorporated herein by reference in its entirety.

BACKGROUND OF THE INVENTION

The present invention relates to a semiconductor device and a method for manufacturing the same, and more particularly, to a semiconductor device with an increased channel length as well as an increased channel width and a method for manufacturing the same.

As design rules of semiconductor devices are rapidly decreased, channel length and width of a transistor are correspondingly decreased. Accordingly, leakage current is increased due to the decreased channel length and as a consequence desired carrier mobility cannot be ensured.

In existing planar channel structures, a method of improving the mobility of the channel should be used to increase the carrier mobility. Accordingly, a method of using strained silicon or silicon germanium (SiGe) as a channel material for improving the mobility of the channel and a method in which the channel is made into a pin shape for increasing the carrier mobility have been suggested.

A process for removing some of the thickness of an isolation layer is required to form the pin shaped channel. However, with decreases in the size of a device, a phenomenon occurs in that an insulation layer for an isolation layer filled in a trench has non-uniform properties over each portion in the trench. Accordingly, portions of the insulation layer having weak etching properties are exposed during a process of removing the isolation layer. This results in a new problem caused by the non-uniform etching speed.

To solve these problems, a method of forming a recess channel structure has been suggested. The recess channel structure is more stable during processing than the method of forming a pin shaped channel. In the recess channel structure, an increase in the channel length leads to improved device properties. The application of the recess channel structure has recently been introduced into the spotlight.

FIG. 1 is a cross-sectional view illustrating a conventional semiconductor device having a recess channel structure. The left drawing is a sectional view taken along a direction of the channel width and the right is a sectional view taken along a direction of the channel length.

In FIG. 1, isolation layers 102 are formed in a semiconductor substrate 100. The isolation layers 102 define active regions 100a. A channel portion in the active region 100a is recessed, and a gate 110 is formed over the channel portion in the recessed active region 100a. The gate 110 includes a gate insulation layer 104 formed over the surface of the recessed channel portion, a gate conductive layer 106 formed over the gate insulation layer 104, and a gate hard mask 108 formed over the gate conductive layer 106.

However, as shown in FIG. 1, while the channel length is increased in a conventional semiconductor device having the recess channel structure described above, the channel width remains unchanged. The channel width typically becomes narrower when the device size is decreased, and thus there is a limitation in ensuring the device properties.

A method has been suggested in which the recess channel structure is combined with the method of forming a pin shaped channel. In this method, the desired device properties are expected to be obtained since the channel length and the channel width can be increased.

However, this method is rarely utilized because of the difficulty in implementing both a process for filling an insulation layer for an isolation layer and an etching process for forming a pin gate.

BRIEF SUMMARY OF THE INVENTION

Embodiments of the present invention are directed to a semiconductor device in which both channel length and channel width are increased, and a method for manufacturing the same.

Further, embodiments of the present invention are directed to a semiconductor device in which the leakage current is reduced and the operation current is increased because of the increase in both channel length and channel width, and a method for manufacturing the same.

In one embodiment, a semiconductor device may comprise a semiconductor substrate having an active region including a channel portion. An isolation layer is formed in the semiconductor substrate to define the active region. A gate is formed over the channel portion in the active region and a portion of the isolation layer extending thereto. The active region of the semiconductor substrate is etched such that the entire active region is below an upper surface of the isolation layer. A U-shaped groove is formed in the channel portion of the active region, except the edges in a direction of the channel width thereof, such that the U-shaped groove increases the channel width.

The active region is placed below an upper surface of the isolation layer at a depth in the range of 20 to 200 nm.

The U-shaped groove is formed a depth of 10 to 500 nm.

In another embodiment, a method for manufacturing a semiconductor device may comprise forming an isolation layer to define an active region in the semiconductor substrate having an active region that includes a channel portion. The channel portion is then first etched. A spacer is then formed over a side wall of the isolation layer exposed by the first etching of the channel portion in the active region and a side wall of the first etched channel portion. The first etched channel portion and the active region that was not first etched are then second etched using the spacer as an etching mask, such that a U-shape groove is formed in the channel portion of the active region and the entire active region is placed below a upper surface of the isolation layer. The spacer is then removed, and a gate is formed over the channel portion in the active region including the U-shape groove and a portion of the isolation layer extending thereto.

The first etching step can be implemented to a depth of 20 to 200 nm.

The spacer is formed to a thickness in the range of 2 to 50 nm.

The spacer can be formed of an insulation layer.

The insulation layer is formed using one of an ALD process, an $O_3$-TEOS process, and a LPCVD process.

The insulation layer can be formed of an oxide layer or a nitride layer.

The second etching step is implemented to a depth in the range of 10 to 500 nm.

DESCRIPTION OF SPECIFIC EMBODIMENTS

A preferred embodiment of the present invention is directed to a semiconductor device in which a channel portion in an active region is first etched and then the first etched channel portion, excluding the edges in a direction of the channel width thereof, is second etched again using a spacer to form a "U" shaped groove below a bottom surface of the first etched channel portion. Accordingly, the channel portion in the active region has not only an increased length in a direction of the channel length but also an increased length in a direction of the channel width. This increase in the channel width is caused by the formation of the "U" shaped groove.

Therefore, in an embodiment of the present invention, the leakage current can be reduced due to the increase in the channel length, and the operation current can be increased as carrier mobility is significantly increased due to the increase in the channel width.

Additionally, the process complexity of the present invention is an improvement over the conventional art (in which a pin shaped channel structure is formed to reduce the leakage current and increase the operation current), since the "U" shaped groove is formed in a relatively simple etching process rather than a difficult etching process.

Hereafter, a semiconductor device in accordance with an embodiment of the present invention and a method for manufacturing the same will be described with reference to the attached drawings.

Figure 1:
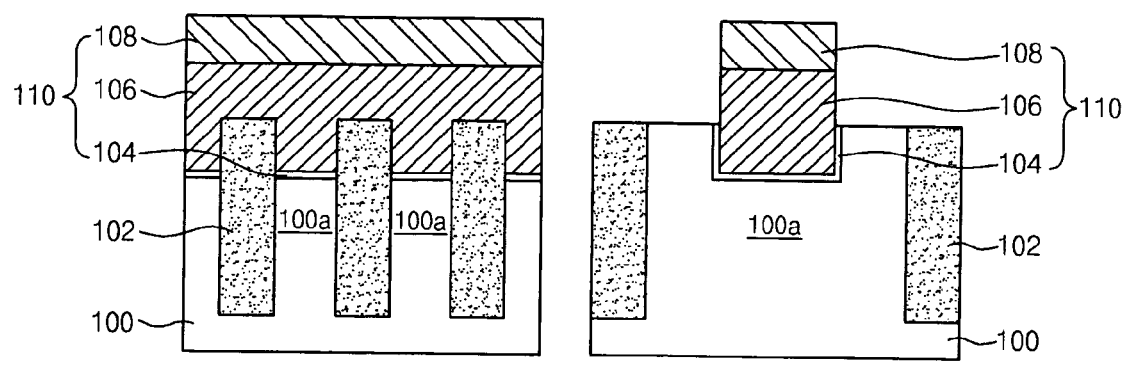
FIG. 1 is a sectional view illustrating a conventional semiconductor device having a recess channel structure.
Figure 2:
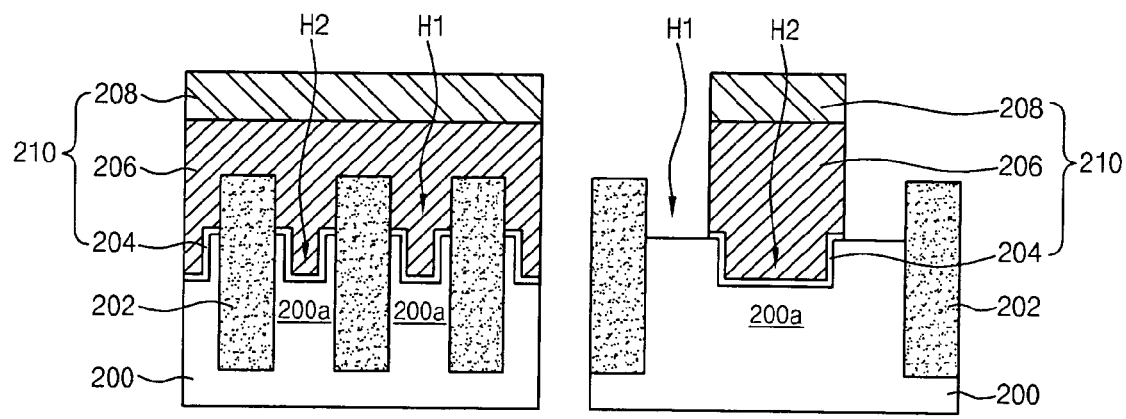
FIG. 2 is a sectional view illustrating a semiconductor device in accordance with an embodiment of the present invention.

FIG. 2 is a sectional view illustrating a semiconductor device in accordance with an embodiment of the present invention. Herein, the left drawing is a sectional view taken along a direction of the channel width, and the right is a sectional view taken along a direction of the channel length.

As shown, an isolation layer 202 defining an active region 200a is formed in a semiconductor substrate 200. The active region 200a includes a channel portion and is etched such that the entire active region 200a is below an upper surface of the isolation layer 202, and thus a first groove H1 is formed over the surface of the active region 200a. For example, the active region 200a may be etched such that it is placed below the upper surface of the isolation layer 202 by approximately 20 to 200 nm.

The channel portion in the active region 200a (excluding the channel portions edges in a direction of the channel width) is etched to form a "U" shaped second groove H2 below a bottom surface of the first etched portion. For example, the first etched channel portion may be etched such that the second groove H2 has a depth of 10 to 500 nm below the bottom surface thereof.

A gate is then formed over the channel portion in the active region 200a that has been first and second etched to form the first and the second grooves H1 and H2. The gate 210 includes a gate insulation layer 204 formed over the surface of the first and second etched channel portion in the active region, a gate conductive layer 206 formed over the gate insulation layer 204, and a gate hard mask 208 formed over the gate conductive layer 206.

Meanwhile, though not shown, an ion implantation area for threshold voltage control is formed in the active region 200a including the first and second etched channel area.

As previously described, in the semiconductor device according to an embodiment of the present invention, an increase in the channel length and the channel width provide the following improvements over a typical planar channel structure: improved leakage current properties, an increase in the operation current, and an increase in the carrier mobility.

FIGS. 3A through 3E are sectional views illustrating the process steps of a method for manufacturing the semiconductor device in accordance with an embodiment of the present invention.

Figure 3A:
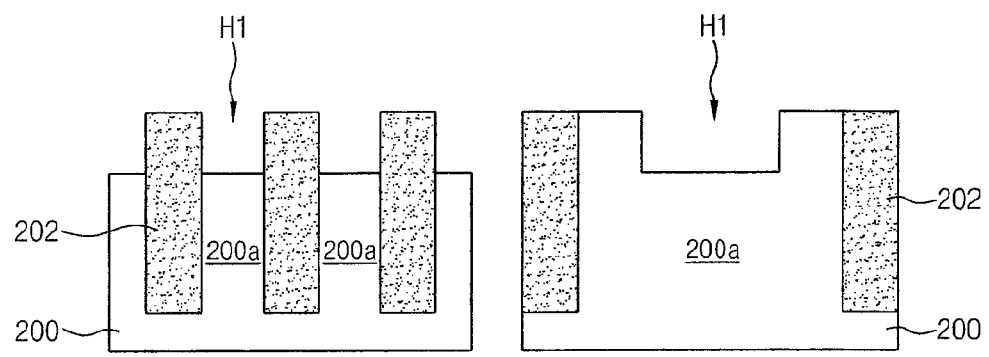
FIGS. 3A through 3E are sectional views illustrating the process steps of a method for manufacturing the semiconductor device in accordance with an embodiment of the present invention.

Referring to FIG. 3A, the isolation layer 202 is formed in the semiconductor substrate 200 to define the active region 200a that includes the channel portion. An area for a gate, i.e. a recess mask (not shown), that selectively exposes the channel portion of the active region 200a, and that is composed of, for example, a laminated layer including an oxide layer and a polysilicon layer is formed over the semiconductor substrate 200 including the isolation layer 202. Using the recess mask as an etching mask, the channel portion of the exposed active region 200a is first etched to form a first groove H1 having a first depth. Preferably, the first etching for forming the first groove H1 is implemented to a depth in the range of 20 to 200 nm.

The isolation layer 202 is formed by filling an insulation layer in a trench. The insulation layer is formed using one or more processes of a high density plasma (HDP) process, a spin on glass (SOG) process, an atomic layer deposition (ALD) process, an $O_3$-TEOS process, and a chemical vapor deposition (CVD) process using peroxide-silane.

When forming a pin shaped channel, a step of removing the isolation layer is necessary. Removing the isolation layer could result in non-uniform etching due to the non-uniform etching speed of the insulation layer. The selection of an insulation layer for an isolation layer, i.e. an insulation layer for filling in the trench is limited. However, in an embodiment of the present invention, the step of removing the isolation layer is unnecessary, and as such the insulation layer for an isolation layer can be freely selected. Particularly, in an embodiment of the present invention, because the selection of material for the insulation layer is not restricted, it is possible to employ not only a single layer, but also a double layer structure in which a porous insulation layer or a fluorinated oxide layer is used as a lower layer, and an insulation layer having a dense structure is used as an upper layer.

Figure 3B:
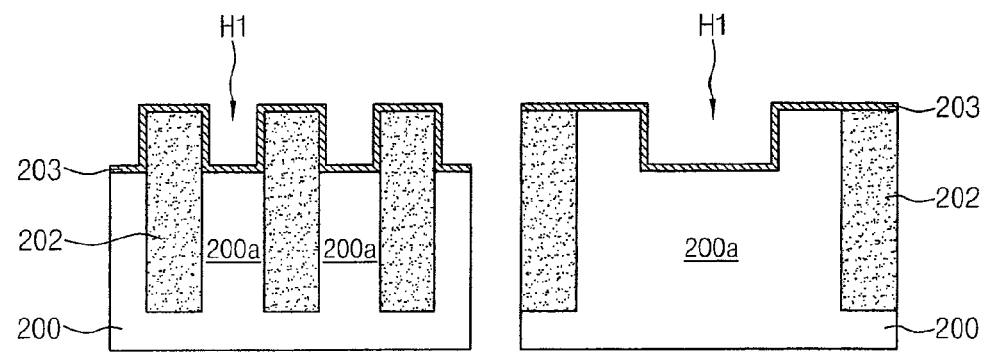

Referring to FIG. 3B, a spacer layer 203 is formed over the isolation layer 202 and the active region 200 having the channel portion formed with the first groove H1. The spacer layer 203 is formed to a thickness in the range of 2 to 50 nm and is formed of, for example, an insulation layer. The insulation layer is formed of an oxide layer or a nitride layer using one of an ALD process, an $O_3$-TEOS process, and a LPCVD process.

Figure 3C:
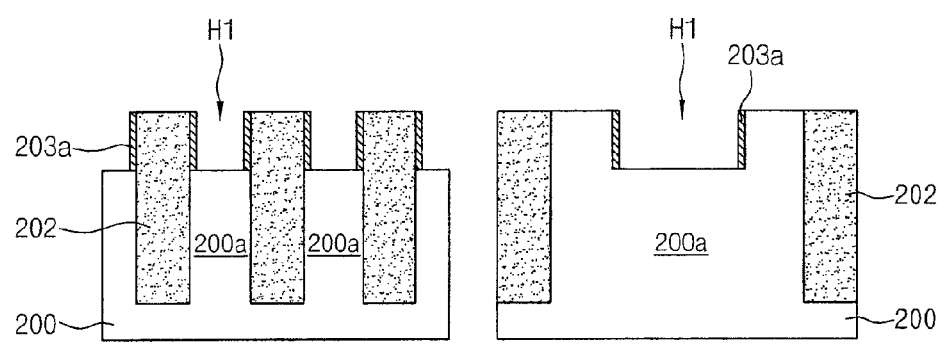

Referring to FIG. 3C, the spacer layer is blanket etched to form a spacer 203a for covering edges of the channel portion, particularly both side edges of the channel portion along the direction of the channel width over the side wall of the first groove H1 including an upper side wall of the isolation layer 202 formed by first etching the channel portion in the active region 200a.

Figure 3D:
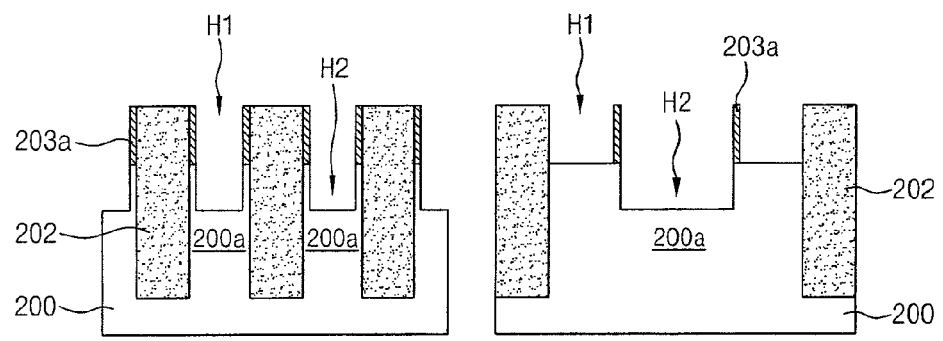

Referring to FIG. 3D, using the spacer 203a as an etching mask, a portion below the bottom surface of the first groove H1 formed over the channel portion and a portion of the active region 200a which is not first etched are second etched, thereby forming the "U" shaped second groove H2 below the bottom surface of the first groove H1 causing the whole active region 200a to be placed below the upper surface of the isolation layer 202. The second etching is implemented so that the second groove H2 has a depth in the range of 10 to 500nm from the bottom surface of the first groove H1.

Because the "U" shaped second groove H2 is not formed in the edges of the channel portion, the channel length as well as the channel width are increased in the structure. Therefore, the leakage current is reduced and the operation current is increased in accordance with an embodiment of the present invention.

Figure 3E:
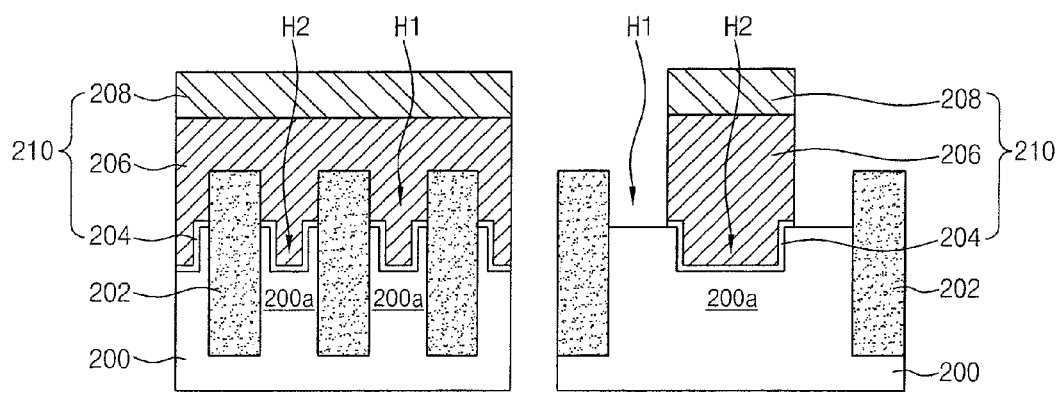

Referring to FIG. 3E, the spacer, which is used as an etching mask, is removed. A gate insulation layer 204 is formed over the active region 200a of the semiconductor substrate 200, including the channel portion formed with the first and second grooves H1 and H2. The gate conductive layer 206 is formed over the gate insulation layer 206 to fill the first and second grooves H1 and H2 and cover the isolation layer 202, and then the surface of the gate conductive layer is planarized. The hard mask layer 208 is formed over the gate conductive layer 206. The hard mask layer 208 is etched to define a gate forming area. The gate conductive layer 206 and the gate insulation layer 204 are then etched using the etched hard mask layer 208 to form the gate 210 over the channel portion in the active region 200a formed with the first and second grooves H1 and H2 and the portion of the isolation layer 202 extending thereto.

Meanwhile, though not shown, before forming the gate, an ion implantation for threshold voltage control is implemented on the active region 200a including the channel portion formed with the first and second grooves H1 and H2 through the first and second etching.

After that, though not shown, a series of known follow up processes including a process of forming source/drain are sequentially preceded, thereby accomplishing the manufacture of the semiconductor device with increased channel length and width.

As is apparent from the above description, in an embodiment of the present invention, the channel length and channel width are increased when a first groove and a "U" shaped second groove are formed in the channel portion using two etching processes. As such, the leakage current properties are improved through the increase in the channel length and the operation current is increased by the increase in the carrier mobility due to the increase in the channel width. Therefore the performance of the semiconductor device is improved by an embodiment of the present invention.

As previously described, in an embodiment of the present invention, the channel portion in the active region is etched two times. However, the isolation layer is not etched. The etching of the isolation layer results in process complexity, and as such an embodiment of the present invention avoids this complexity.

In addition, in an embodiment of the present invention, by excluding the etching of the isolation layer, it is possible to employ a double layer structure as a material for the isolation layer as well as a single layer structure. In the double layer structure a porous insulation layer or a fluorinated oxide layer is used as a lower layer and an insulation layer having a dense structure is used as an upper layer. It is therefore possible to ensure a wide selection margin of the material for the isolation layer.

Although a specific embodiments of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, comprising the steps of:
    forming an isolation layer in the semiconductor substrate to define an active region that includes a channel portion;
    first etching the channel portion in the active region;
    forming a spacer over a side wall of the isolation layer exposed by the first etching of the channel portion in the active region and a side wall of the first etched channel portion;
    second etching the first etched channel portion, except the edges in a direction of the channel width thereof and the portion of the active region that is not first etched using the spacer as an etching mask so that a U-shape groove is formed in the channel portion of the active region and the entire active region is placed below a upper surface of the isolation layer;
    removing the spacer; and
    forming a gate over the channel portion in the active region including the U-shape groove.

2. The method for manufacturing a semiconductor device according to claim 1, wherein the first etching step is implemented to a depth in the range of 20 to 200 nm.

3. The method for manufacturing a semiconductor device according to claim 1, wherein the spacer is formed to a thickness in the range of 2 to 50 nm.

4. The method for manufacturing a semiconductor device according to claim 1, wherein the spacer is formed of an insulation layer.

5. The method for manufacturing a semiconductor device according to claim 4, wherein the insulation layer is formed using one of an ALD process, an $O_3$-TEOS process, and a LPCVD process.

6. The method for manufacturing a semiconductor device according to claim 4, wherein the insulation layer is formed of an oxide layer or a nitride layer.

7. The method for manufacturing a semiconductor device according to claim 1, wherein the second etching step is implemented to a depth in the range of 10 to 500 nm.

* * * * *